(12) United States Patent
Lee

(10) Patent No.: US 8,643,355 B2
(45) Date of Patent: Feb. 4, 2014

(54) METHOD FOR GENERATING A SIGNAL AND STRUCTURE THEREFOR

(75) Inventor: Kisun Lee, San Jose, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 249 days.

(21) Appl. No.: 13/022,295

(22) Filed: Feb. 7, 2011

(65) Prior Publication Data

US 2012/0200321 A1 Aug. 9, 2012

(51) Int. Cl.
  *G05F 1/00* (2006.01)
(52) U.S. Cl.
  USPC ......................................................... 323/288
(58) Field of Classification Search
  USPC .................................................. 323/282–288
  See application file for complete search history.

(56) References Cited

U.S. PATENT DOCUMENTS

| | | | |
|---|---|---|---|
| 4,280,082 A * | 7/1981 | Acharya et al. | 388/811 |
| 5,140,591 A * | 8/1992 | Palara et al. | 327/109 |
| 7,595,617 B2 | 9/2009 | Schiff | |
| 7,741,824 B2 | 6/2010 | Schiff | |
| 7,812,581 B2 | 10/2010 | Qiu et al. | |
| 7,956,651 B2 * | 6/2011 | Ptacek et al. | 327/74 |
| 8,253,403 B2 * | 8/2012 | Chen et al. | 323/282 |
| 2011/0121806 A1 * | 5/2011 | Garrett et al. | 323/282 |

OTHER PUBLICATIONS

Dual-Edge Pulse Width Modulation Scheme for Fast Transient Response of Multiple-Phase Voltage Regulators, Weihong Qiu, Greg Miller, (George) Zhixiang Liang, IEEE, APEC 2007, pp. 1563-1569.
Ripple-Based Control of Switching Regulators—An Overview, Richard Redl and Jian Sun, IEEE Transactions on Power Electronics, vol. 24 No. 12, Dec. 2009, pp. 2669-2680.

* cited by examiner

*Primary Examiner* — Aldolf Berhane
*Assistant Examiner* — Yemane Mehari
(74) *Attorney, Agent, or Firm* — Rennie William Dover

(57) ABSTRACT

In accordance with an embodiment, a modulator includes a comparator and ramp generating circuitry. A first comparison signal is generated in response to comparing a first input signal with a compensation signal. A second comparison signal is generated in response to comparing a second input signal with the compensation signal. A first latch signal is generated in response to the first comparison signal and a second latch signal is generated in response to the second comparison signal.

26 Claims, 5 Drawing Sheets

METHOD FOR GENERATING A SIGNAL AND STRUCTURE THEREFOR

BACKGROUND

The present invention relates, in general, to electronics and, more particularly, to methods of forming semiconductor devices and structure.

Numerous techniques have been used to control switching power supplies. One of the most common is known as pulse-width modulation (PWM) in which the switching frequency is held constant while the duty cycle is modulated to control the output. Another common technique is known as pulse frequency modulation (PFM) in which the switch on-time or off-time is held constant, and the frequency is modulated to control the output. In another technique known as hysteretic control (or ripple regulation) frequency and duty cycle are varied to keep the output ripple constant.

Accordingly, it would be advantageous to have a method and circuit suitable for use in controlling switching power supplies. It would be of further advantage for the method and structure to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
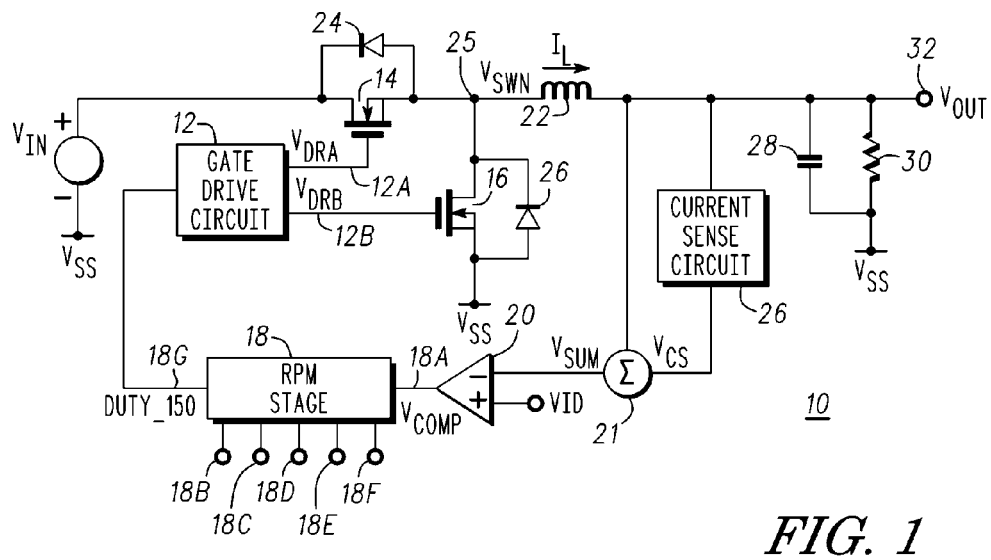
FIG. 1 is a circuit schematic of a converter that includes a ramp pulse modulation stage in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain N-channel or P-channel devices, or certain N-type or P-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the word approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

It should be noted that a logic zero voltage level ($V_L$) is also referred to as a logic low voltage and that the voltage level of a logic zero voltage is a function of the power supply voltage and the type of logic family. For example, in a Complementary Metal Oxide Semiconductor (CMOS) logic family a logic zero voltage may be thirty percent of the power supply voltage level. In a five volt Transistor-Transistor Logic (TTL) system a logic low voltage level may be about 0.8 volts, whereas for a five volt CMOS system, the logic zero voltage level may be about 1.5 volts. A logic one voltage level ($V_H$) is also referred to as a logic high voltage level and, like the logic zero voltage level, the logic high voltage level also may be a function of the power supply and the type of logic family. For example, in a CMOS system a logic one voltage may be about seventy percent of the power supply voltage level. In a five volt TTL system a logic one voltage may be about 2.4 volts, whereas for a five volt CMOS system, the logic one voltage may be about 3.5 volts.

DETAILED DESCRIPTION

FIG. 1 is a circuit schematic of a voltage regulator 10 in accordance with an embodiment of the present invention. Voltage regulator 10 includes a drive circuit 12 configured to drive switching devices 14 and 16 in response to a Ramp Pulse Modulation (RPM) signal from a ramp pulse modulator 18. Drive circuit 12 may be referred to as a gate drive circuit and ramp pulse modulator 18 may be referred to as an RPM stage. Ramp pulse modulator 18 is configured to operate in response to a compensation signal ($V_{COMP}$). Switching devices 14 and 16 may be power field effect transistors, such as, for example, power Metal Oxide Semiconductor Field Effect Transistors (MOSFETs), where each switching device has a control electrode and a pair of current carrying electrodes. As discussed above, the control electrodes may be gate terminals and the current carrying electrodes may be drain and source terminals. It should be noted that FIG. 1 illustrates body diodes 24 and 26 of switching devices 14 and 16, respectively, and that the source terminals of switching devices 14 and 16 are connected to their body regions. The drain terminal of switching device 14 is coupled for receiving an input signal ($V_{IN}$) and the source terminal of switching device 14 is commonly connected to the drain terminal of switching device 16 and to a terminal of an inductor 22. The source terminal of switching device 16 is coupled for receiving a source of operating potential such as, for example, $V_{SS}$. Potential $V_{SS}$ may be, for example, a ground potential. The other terminal of inductor 22 is commonly connected to an input terminal of a summer 21, an input terminal of a current sense circuit 26, a terminal of an output capacitor 28, and a terminal of a load 30 to form an output terminal or node 32 at which an output voltage $V_{OUT}$ appears. Summer 21 has an input terminal connected to an output terminal of current sense circuit 26. The output terminal of summer 21 is connected to an input terminal of a compensation circuit 20. Compensation circuit 20 has another input terminal, which is coupled for receiving, for example, a voltage identification digital (VID) control signal, and an output terminal connected to an input terminal 18A of ramp pulse modulator 18. By way of example, compensation circuit 20 is a comparator. In addition to input terminal 18A, ramp pulse modulator 18 has at least input terminals 18B, 18C, 18D, 18E, and 18F and an output terminal 18G, which output terminal is connected to an input terminal of drive circuit 12. Output terminals 12A and 12B of gate drive circuit 12 are connected to the gate terminals of switching devices 14 and 16, respectively.

In operation and in response to an input voltage $V_{IN}$ at the drain terminal of switching device 14 and drive signals $V_{DRA}$ and $V_{DRB}$ at the gate terminals of switching transistors 14 and 16, a switching voltage $V_{SWN}$ appears at node 25 and a current $I_L$ flows through inductor 22. Inductor current $I_L$ flows through load 30 and generates an output voltage $V_{OUT}$ at output node 32. Inductor current $I_L$ is sensed by current sense circuit 26 to generate a current sense signal $V_{CS}$. Current sense signal $V_{CS}$ and output signal $V_{OUT}$ are summed or added together by summer 21 to generate a summed signal $V_{SUM}$, which is transmitted to the inverting input terminal of compensation circuit 20. In response to summed signal $V_{SUM}$ and control signal VID, compensation circuit 20 generates a compensation signal $V_{COMP}$, which serves as an input signal for ramp pulse modulator 18. Ramp pulse modulator 18 generates a pulse signal DUTY_10 at output terminal 18G that causes drive circuit 12 to generate drive signals $V_{DRA}$ and $V_{DRB}$. The operation of ramp pulse modulator 18 will be explained in more detail below with reference to FIG. 2.

Figure 2:
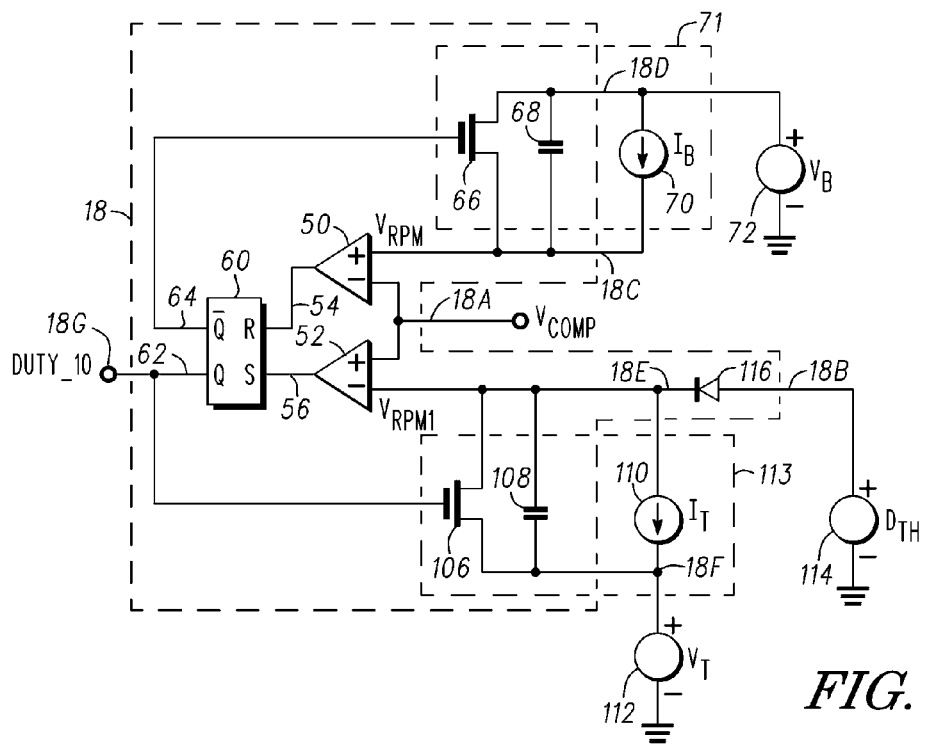
FIG. 2 is circuit schematic of a ramp pulse modulation stage in accordance with an embodiment of the present invention.

FIG. 2 is a circuit schematic of ramp pulse modulation circuit 18 in accordance with an embodiment of the present invention. Ramp pulse modulation circuit 18 comprises comparators 50 and 52 each having a noninverting input terminal, an inverting input terminal, and an output terminal. The inverting input terminal of comparator 50 and the noninverting input terminal of comparator 52 are connected together and coupled for receiving compensation signal $V_{COMP}$ at terminal 18A of ramp pulse modulator 18. Comparator 50 has an output terminal 54 connected to the reset input terminal (R) of a latch 60 and comparator 52 has an output terminal 56 connected to the set input terminal (S) of latch 60. The signals that appear at comparator output terminals 54 and 56 are referred to as comparison signals. Latch 60 has an output terminal 62 that serves as output terminal 18G (shown in FIG. 1) and an output terminal 64 that is connected to a control electrode of a transistor 66. Output terminal 18G is connected to the input terminal of drive circuit 12 (shown in FIG. 1).

In addition to a control electrode, transistor 66 has current carrying electrodes such as, for example drain and source electrodes or terminals. By way of example, the source terminal is commonly connected to a terminal of a capacitor 68 and to a terminal of a current source 70 to form an input terminal such as, for example, input terminal 18D of ramp pulse modulator 18. The commonly connected source terminal and terminals of capacitor 68 and current source 70 are coupled for receiving a potential $V_B$ from voltage source 72. The drain terminal is commonly connected to the other terminals of capacitor 68 and current source 70 and to the noninverting input terminal of comparator 50 and may serve as terminal 18C shown in FIG. 1. Current source 70 is coupled between terminals 18D and 18C and sources a current signal $I_B$. Transistor 66, capacitor 68, and current source 70 may be referred to as a ramp generation circuit 71.

Ramp pulse modulator 18 further includes a transistor 106 having a control electrode and current carrying electrodes. Output terminal 62 (and therefore terminal 18G) is connected to the control electrode of transistor 106. The source terminal of transistor 106 is commonly connected to a terminal of capacitor 108 and to the inverting input terminal of comparator 52 to form a node that can serve as input terminal 18E. A ramp pulse modulation signal $V_{RPM1}$ appears at the inverting input terminal of comparator 52. The drain terminal of transistor 106 is connected to the other terminal of capacitor 108 to form a node that may serve as input terminal 18F. A current source 110 is connected between input terminals 18E and 18F and a voltage source 112 is connected to input terminal 18F. Transistor 106, capacitor 108, and current source 110 may be referred to as a ramp generation circuit 113. Voltage source 112 provides a voltage $V_T$ and current source 110 sources a current $I_T$. A diode 116 has a cathode connected to input terminal 18E and an anode that serves as input terminal 18B.

A voltage source 114 is coupled to input terminal 18B, voltage source 72 is connected to input terminal 18D, and a voltage source 112 is connected to input terminal 18F.

Output terminal 18G is connected to the input terminal of drive circuit 12 (shown in FIG. 1).

Figure 3:
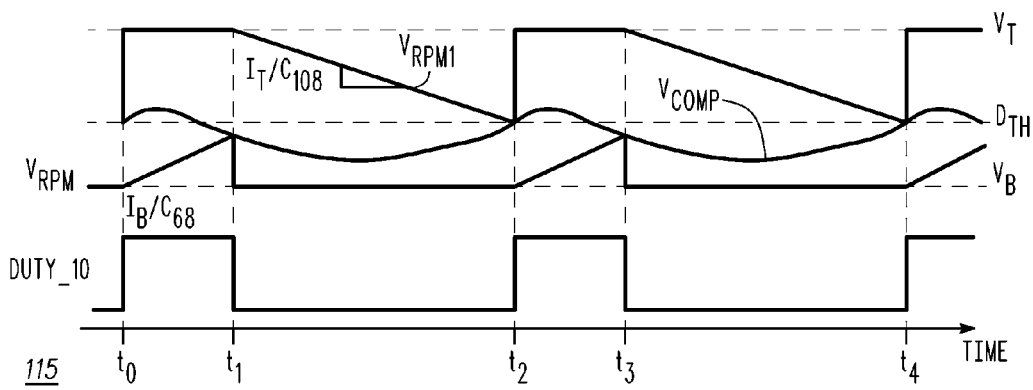
FIG. 3 is a timing diagram of circuit parameters of the ramp pulse modulation stage of FIG. 2 in accordance with an embodiment of the present invention.

In operation, input signals $V_{COMP}$, $D_{TH}$, $V_B$, and $V_T$ are coupled to input terminals 18A, 18B, 18D, and 18F, respectively, of ramp pulse modulator 18 (shown in FIGS. 1 and 2). Current source 70 is connected between input terminals 18D and 18C (shown in FIGS. 1 and 2) and in response to the input signal at the control electrode of transistor 66 the current flowing through current source 70 generates an input signal $V_{RPM}$ at the noninverting input terminal of comparator 50, i.e., input terminal 18C. FIG. 3 is a timing diagram 115 showing signals $V_{COMP}$, $V_B$, $D_{TH}$, $V_{RPM}$, $V_{RPM1}$, $V_T$, and pulse signal DUTY_10. Referring now to FIGS. 2 and 3, before time $t_0$, a logic high voltage level appears at output terminal 64, i.e., at the Qbar output, of latch 60 and a logic low voltage level appears at output terminal 62, i.e., at the Q output, of latch 60. The logic high voltage level at output terminal 64 appears at the gate terminal of transistor 66 and turns it on. Thus the voltage at input terminal 18C, i.e., the noninverting input terminal of comparator 50, is substantially equal to voltage $V_B$ and capacitor 68 is discharged to make the voltage at terminal 18C substantially equal to that at terminal 18D. Because voltage $V_{RPM}$ is less than voltage $V_{COMP}$ before time $t_0$, comparator 50 generates a logic low voltage at output terminal 54.

As the time approaches time $t_0$ from a time before time $t_0$, voltage $V_{RPM1}$ approaches voltage $D_{TH}$.

In response to voltage $V_{COMP}$ increasing and crossing through voltage level $V_{RPM1}$ at time $t_0$, comparator 52 generates a logic high voltage at its output, which signal is transferred via output terminal 56 to the set input terminal (S) of latch 60. In response to the logic high voltage at the set input terminal of latch 60, the signal at Q output terminal 62, i.e., output terminal 18G, transitions to a logic high voltage level. It should be noted that Q output terminal 62 of latch 60 serves as output terminal 18G of ramp pulse modulator 18 and the signal at the Q output terminal serves as a pulse signal (DUTY_10) that is transmitted to the input terminal of drive circuit 12.

The logic high voltage at output terminal 62 turns on transistor 106, which sets voltage $V_{RPM1}$ at input node 18E to a voltage substantially equal to voltage $V_T$. In addition, latch 60 generates a logic low voltage at output terminal 64 which turns off transistor 66. Current source 70 generates a current $I_B$ which charges capacitor 68 such that the voltage at input terminal 18D, i.e., at the noninverting input terminal of comparator 50, increases at a rate of approximately $I_B/C_{68}$ volts per second, where $I_B$ is the current sourced by current source 70 and $C_{68}$ is the capacitance value of capacitor 68. Thus, the voltage $V_{RPM}$ at the noninverting input terminal of comparator 50 is a ramp signal having a slope of approximately $I_B/C_{68}$.

At time $t_1$, voltage $V_{COMP}$ crosses through the voltage level of voltage $V_{RPM}$ and after time $t_1$ becomes less than voltage $V_{RPM}$. In response to voltage $V_{COMP}$ becoming less than voltage $V_{RPM}$ and the logic high voltage level at the reset input terminal (R) of latch 60, a logic low voltage level appears at output terminal 62, which turns off transistor 106. Current source 110 sources a current $I_T$ which charges capacitor 108 such that the voltage at input terminal 18E, i.e., at the inverting input terminal of comparator 52, decreases at a rate of approximately $I_T/C_{108}$ volts per second, where current $I_T$ is the current sourced by current source 110 and $C_{108}$ is the capacitance value of capacitor 108. Thus, the voltage $V_{RPM1}$ at the noninverting input terminal of comparator 52 is a substantially constant voltage from approximately time $t_0$ to approximately time $t_1$ and is a ramp signal from approximately time $t_1$ to approximately time $t_2$ having a negative slope of approximately $I_T/C_{108}$. It should be noted that pulse signal DUTY_10 appearing at output terminal 62 transitions to a logic low voltage level at time $t_1$ and that the duration of pulse signal DUTY_10 being at a logic high voltage and the duration of the constant voltage portion of voltage $V_{RPM1}$ are substantially equal. It should be further noted that the period of pulse signal DUTY_10 is substantially equal to the period of voltage signal $V_{RPM1}$, i.e., the sum of the time at which signal $V_{RPM1}$ is at a substantially constant voltage level and the time that signal $V_{RPM1}$ is a ramp. The duration of the constant voltage portion of signal $V_{RPM1}$ is substantially equal to the duration at which pulse signal DUTY_10 is at a logic high voltage level and the duration of the ramp portion of voltage signal $V_{RPM1}$ is substantially equal to the duration at which pulse signal DUTY_10 at a logic low voltage level.

Between times $t_1$ and $t_2$, a logic high voltage level appears at output terminal 64, i.e., at the Qbar output, of latch 60 and a logic low voltage level appears at output terminal 62, i.e., at the Q output, of latch 60. The logic high voltage level at output terminal 64 appears at the gate terminal of transistor 66 and turns it on. Thus voltage $V_{RPM}$ at input terminal 18C, i.e., the noninverting input terminal of comparator 50, is substantially equal to voltage $V_B$ and capacitor 68 is discharged to a make the voltage at input terminal 18C substantially equal to that at input terminal 18A. Because voltage $V_{RPM}$ is less than voltage $V_{COMP}$ between times $t_1$ and $t_2$, comparator 50 generates a logic low voltage at output terminal 54.

In response to voltage $V_{COMP}$ increasing and becoming greater than voltage $V_{RPM1}$ at time $t_2$, comparator 52 generates a logic high voltage at its output, which signal is transferred via output terminal 56 to the set input terminal of latch 60 and causes the signal at the Q output terminal to transition to a logic high voltage level. As noted above, the Q output terminal of latch 60 serves as output terminal 18G of ramp pulse modulator 18 and the signal at the Q output terminal serves as pulse signal DUTY_10 that is transmitted to the input terminal of drive circuit 12.

The logic high voltage at output terminal 62 turns on transistor 106, which sets voltage $V_{RPM1}$ at input terminal 18E to a voltage substantially equal to voltage $V_T$. In addition, the logic high voltage at output terminal 62 causes latch 60 to generate a logic low voltage at output terminal 64 which turns off transistor 66. Current source 70 sources a current $I_B$ which charges capacitor 68 such that the voltage at input terminal 18C, i.e., at the noninverting input terminal of comparator 50, increases at a rate of approximately $I_B/C_{68}$ volts per second, where $I_B$ is the current sourced by current source 70 and $C_{68}$ is the capacitance value of capacitor 68. Thus, beginning at about time $t_2$ the voltage $V_{RPM}$ at the noninverting input terminal of comparator 50 is a ramp signal having a slope of approximately $I_B/C_{68}$.

At time $t_3$, voltage $V_{COMP}$ becomes less than voltage $V_{RPM}$. In response to voltage $V_{COMP}$ becoming less than voltage $V_{RPM}$ and the logic high voltage level at the reset input of latch 60, a logic low voltage level appears at output terminal 62, which turns off transistor 106. Current source 110 generates a current $I_T$ which charges capacitor 108 such that voltage $V_{RPM1}$ at input terminal 18E, i.e., at the inverting input terminal of comparator 52, decreases at a rate of approximately $I_T/C_{108}$ volts per second. Thus, voltage $V_{RPM1}$ at the inverting input terminal of comparator 52 is a substantially constant voltage from approximately time $t_2$ to approximately time $t_3$ and is a ramp signal from approximately time $t_3$ to approximately time $t_4$ having a negative slope of $I_T/C_{108}$. It should be noted that pulse signal DUTY_10 appearing at output terminal 62 transitions to a logic low voltage level at time $t_3$ and that the duration of pulse signal DUTY_10 being at a logic high voltage and the duration of the constant voltage portion of voltage $V_{RPM1}$ are substantially equal. It should be further noted that the period of pulse signal DUTY_10 is substantially equal to the sum of the time that pulse signal DUTY_10 is at a logic high voltage level and the time that pulse signal DUTY_10 is at a logic low voltage level. Thus, the period of pulse signal DUTY_10 is substantially equal to the period of voltage signal $V_{RPM1}$, i.e., the sum of the time at which signal $V_{RPM1}$ is at a substantially constant voltage level and the time that signal $V_{RPM1}$ is a ramp. The duration of the constant voltage portion of signal $V_{RPM1}$ is substantially equal to the duration at which pulse signal DUTY_10 is at a logic high voltage level and the duration of the ramp portion of voltage signal $V_{RPM1}$ is substantially equal to the duration at which pulse signal DUTY_10 at a logic low voltage level.

Between times $t_3$ and $t_4$, a logic high voltage level appears at output terminal 64, i.e., at the Qbar output, of latch 60 and a logic low voltage level appears at output terminal 62, i.e., at the Q output, of latch 60. The logic high voltage level at output terminal 64 appears at the gate terminal of transistor 66 and turns it on. Thus voltage $V_{RPM}$ at input terminal 18C, i.e., the noninverting input terminal of comparator 50, is substantially equal to voltage $V_B$ and capacitor 68 is discharged to a make voltage $V_{RPM}$ at input terminal 18C substantially equal to that at input terminal 18A. Because voltage $V_{RPM}$ is less than voltage $V_{COMP}$ between times $t_3$ and $t_4$, comparator 50 generates a logic low voltage at output terminal 54. In response to voltage $V_{COMP}$ increasing and becoming greater than voltage level $V_{RPM1}$ at time $t_4$, comparator 52 generates a logic high voltage at its output, which signal is transferred via output terminal 56 to the set input terminal of latch 60 and causes the signal at Q output terminal 62 to transition to a logic high voltage level. As noted above, Q output terminal 62 of latch 60 serves as output terminal 18G of ramp pulse modulator 18 and the signal at the Q output terminal 62 serves as pulse signal DUTY_10 that is transmitted to the input terminal of drive circuit 12.

Ramp pulse modulator 18 generates a pulse signal DUTY_10 that is at a logic high voltage for a time that is coincident with the ramp portion of voltage $V_{RPM}$ and is at a logic low voltage for a time that is coincident with the ramp portion of voltage $V_{RPM1}$. For example, pulse signal DUTY_10 transitions from a logic low voltage to a logic high voltage in response to voltage signal $V_{RPM}$ beginning to rise from voltage level $V_B$ and pulse signal DUTY_10 transitions from the logic high voltage to the logic low voltage in response to voltage signal $V_{RPM1}$ beginning to decrease from voltage level $V_T$. Thus, the frequency of pulse signal DUTY_10 varies in accordance with the ramp portions of voltage signals $V_{RPM}$ and $V_{RPM1}$.

Figure 4:
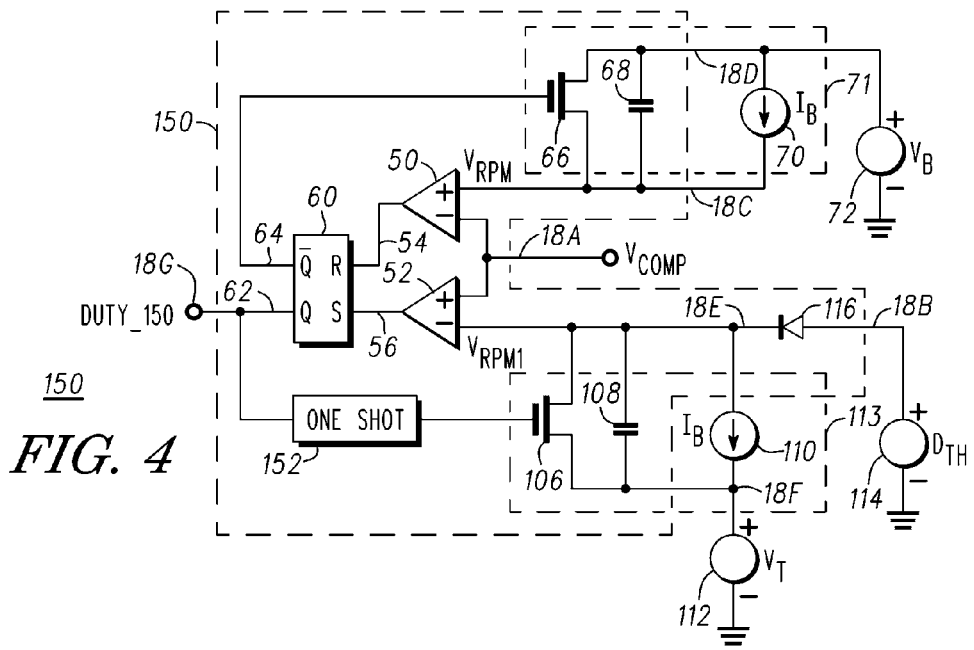
FIG. 4 is circuit schematic of a ramp pulse modulation stage in accordance with an embodiment of the present invention.

FIG. 4 is a circuit schematic of ramp pulse modulation circuit 150 in accordance with an embodiment of the present invention. It should be noted that the input/output configuration of ramp pulse modulation circuit 150 may be the same as that of ramp pulse modulation circuit 18. Thus, ramp pulse modulation circuit 18 can be replaced by ramp pulse modulation circuit 150. It should be further noted that the operation of voltage regulator 10 described with reference to FIGS. 1 and 2 may also apply to embodiments in which ramp pulse modulation circuit 150 replaces ramp pulse modulation circuit 18. Ramp pulse modulation circuit 150 comprises comparators 50 and 52, latch 60, transistors 66 and 106, capacitors 68 and 108, diode 116, input terminals 18A, 18B, 18C, 18D, 18E, and 18F, and output terminal 18G as described with reference to FIG. 2. In addition, ramp pulse modulation circuit 150 includes a one shot 152 connected between output terminal 62 and the gate of transistor 106.

A voltage source 114 is coupled to input terminal 18B, voltage source 72 is connected to input terminal 18D, and a voltage source 112 is connected to input terminal 18F.

Output terminal 18G is connected to the input terminal of drive circuit 12 (shown in FIG. 1).

Figure 5:
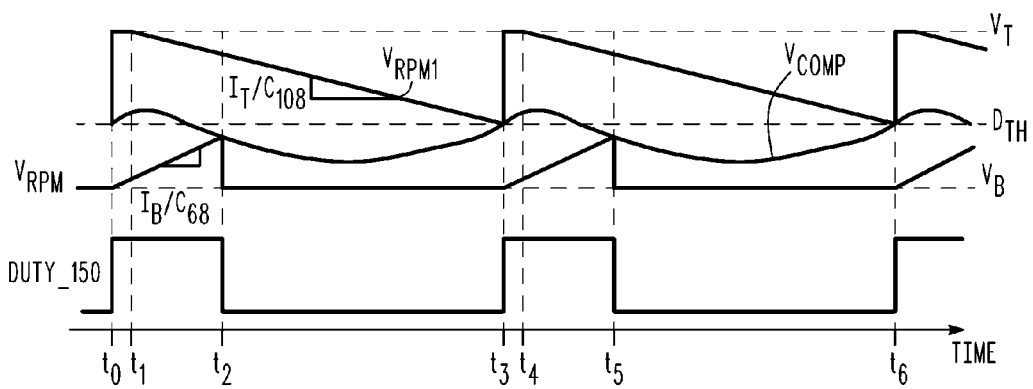
FIG. 5 is a timing diagram of circuit parameters of the ramp pulse modulation stage of FIG. 4 in accordance with an embodiment of the present invention.

In operation, input signals $V_{COMP}$, $D_{TH}$, $V_B$, and $V_T$ are coupled to input terminals 18A, 18B, 18D, and 18F, respectively, of ramp pulse modulator 150 (shown in FIGS. 1 and 4). Current source 70 is connected between input terminals 18D and 18C (shown in FIG. 4) and in response to the input signal at the control electrode of transistor 66 the current flowing through current source 70 generates an input signal $V_{RPM}$ at the noninverting input terminal of comparator 50, i.e., input terminal 18C. FIG. 5 is a timing diagram 155 showing signals $V_{COMP}$, $V_B$, $D_{TH}$, $V_{RPM}$, $V_{RPM1}$, $V_T$, and pulse signal DUTY_150. Referring now to FIGS. 4 and 5, before time $t_0$, a logic high voltage level appears at output terminal 64, i.e., at the Qbar output, of latch 60 and a logic low voltage level appears at output terminal 62, i.e., at the Q output, of latch 60. The logic high voltage level at output terminal 64 appears at the gate terminal of transistor 66 and turns it on. Thus the voltage at input terminal 18C, i.e., the noninverting input terminal of comparator 50, is substantially equal to voltage $V_B$ and capacitor 68 is discharged to make voltage $V_{RPM}$ at terminal 18C substantially equal to that at terminal 18D. Because voltage $V_{RPM}$ is less than voltage $V_{COMP}$ before time $t_0$, comparator 50 generates a logic low voltage at output terminal 54.

Before time $t_0$, voltage $V_{RPM1}$ approaches voltage $D_{TH}$.

In response to voltage $V_{COMP}$ increasing and crossing through the signal level of signal $V_{RPM1}$ at time $t_0$, comparator 52 generates a logic high voltage at its output, which signal is transferred via output terminal 56 to the set input terminal of latch 60. In response to the logic high voltage at the set input terminal of latch 60, the signal at Q output terminal 62, i.e., output terminal 18G transitions to a logic high voltage level. It should be noted that Q output terminal 62 of latch 60 serves as output terminal 18G of ramp pulse modulator 18 and the signal at the Q output terminal serves as a pulse signal (DUTY_150) that is transmitted to the input terminal of drive circuit 12.

The logic high voltage level at output terminal 62 appears at the input terminal of one shot 152 and triggers one shot 152. Thus, a logic high voltage appears at the control electrode of transistor 106, turning on transistor 106, which sets voltage $V_{RPM1}$ at input node 18E to a voltage substantially equal to voltage $V_T$. In addition, latch 60 generates a logic low voltage at output terminal 64 which turns off transistor 66. Current source 70 generates a current $I_B$ which charges capacitor 68 such that the voltage at input terminal 18D, i.e., at the noninverting input terminal of comparator 50, increases at a rate of approximately $I_B/C_{68}$ volts per second. Thus, the voltage $V_{RPM}$ at the noninverting input terminal of comparator 50 is a ramp signal having a slope of approximately $I_B/C_{68}$.

One shot 152 creates at logic high voltage at the control electrode of transistor 106 for a fixed period of time. This fixed time period ends at time $t_1$. Thus, at time $t_1$ one shot 152 reverts to its stable state which turns off transistor 106. Current source 110 sources a current $I_T$ which charges capacitor 108 such that the voltage at input terminal 18E, i.e., at the inverting input terminal of comparator 52, decreases at a rate of approximately $I_T/C_{108}$ volts per second. Thus, the voltage $V_{RPM}$ at the noninverting input terminal of comparator 52 is a substantially constant voltage from approximately time $t_0$ to approximately time $t_1$ and is a ramp signal from approximately time $t_1$ to approximately time $t_3$ and has a negative slope of $I_T/C_{108}$. The period of pulse signal DUTY_150 is substantially equal to the sum of the time that pulse signal DUTY_150 is at a logic high voltage level and the time that pulse signal DUTY_150 is at a logic low voltage level. The period of pulse signal DUTY_150 is substantially equal to the period of voltage signal $V_{RPM1}$, i.e., the sum of the time at which signal $V_{RPM1}$ is at a substantially constant voltage level and the time that signal $V_{RPM1}$ is a ramp signal.

At time $t_2$, compensation signal $V_{COMP}$ becomes substantially equal to voltage $V_{RPM}$, which causes comparator 50 to generate a logic high voltage at output 54. In response to the logic high voltage appearing at output 54, a logic high voltage appears at output 64 of latch 60 and a logic low voltage appears at output 62 of latch 60. Accordingly, pulse signal DUTY_150 transitions to a logic low voltage level.

Between times $t_2$ and $t_3$, a logic high voltage level appears at output terminal 64, i.e., at the Qbar output, of latch 60 and a logic low voltage level appears at output terminal 62, i.e., at the Q output, of latch 60. The logic high voltage level at output terminal 64 appears at the gate terminal of transistor 66 and turns it on. Thus voltage $V_{RPM}$ at input terminal 18C, i.e., the noninverting input terminal of comparator 50, is substantially equal to voltage $V_B$ and capacitor 68 is discharged to a make voltage $V_{RPM}$ at input terminal 18C substantially equal to that at input terminal 18A. Because voltage $V_{RPM}$ is less than voltage $V_{COMP}$ between times $t_2$ and $t_3$, comparator 50 generates a logic low voltage at output terminal 54.

In response to voltage $V_{COMP}$ increasing and becoming greater than voltage $V_{RPM1}$ at time $t_3$, comparator 52 generates a logic high voltage at its output, which signal is transferred via output terminal 56 to the set input terminal of latch 60 and causes the signal at the Q output terminal to transition to a logic high voltage level. As noted above, the Q output terminal of latch 60 serves as output terminal 18G of ramp pulse modulator 18 and the signal at the Q output terminal serves as pulse signal DUTY_150 that is transmitted to the input terminal of drive circuit 12.

The logic high voltage level at output terminal 62 appears at the input terminal of one shot 152 and triggers one shot 152. Thus, a logic high voltage appears at the control electrode of transistor 106, turning on transistor 106, which sets voltage $V_{RPM1}$ at input node 18E to a voltage substantially equal to voltage $V_T$. In addition, latch 60 generates a logic low voltage at output terminal 64 which turns off transistor 66. Current source 70 generates a current $I_B$ which charges capacitor 68 such that voltage $V_{RPM}$ at input terminal 18C, i.e., at the noninverting input terminal of comparator 50, increases at a rate of approximately $I_B/C_{68}$ volts per second. Thus, voltage $V_{RPM}$ at the noninverting input terminal of comparator 50 is a ramp signal having a slope of approximately $I_B/C_{68}$.

One shot 152 creates at logic high voltage at the control electrode of transistor 106 for a fixed period of time. This fixed time period ends at time $t_4$. Thus, at time $t_4$ one shot 152 reverts to its stable state which turns off transistor 106. Current source 110 sources a current $I_T$ which charges capacitor 108 such that voltage $V_{RPM1}$ at input terminal 18E, i.e., at the inverting input terminal of comparator 52, decreases at a rate of approximately $I_T/C_{108}$ volts per second. Thus, the voltage $V_{RPM1}$ at the noninverting input terminal of comparator 52 is a substantially constant voltage from approximately time $t_3$ to approximately time $t_4$ and is a ramp signal from approximately time $t_4$ to approximately time $t_6$ having a slope of $I_T/C_{108}$. The period of pulse signal DUTY_150 is substantially equal to the sum of the time that pulse signal DUTY_150 is at a logic high voltage level and the time that pulse signal DUTY_150 is at a logic low voltage level. The period of pulse signal DUTY_150 is substantially equal to the period of voltage signal $V_{RPM1}$, i.e., the sum of the time at which signal $V_{RPM1}$ is at a substantially constant voltage level and the time that signal $V_{RPM1}$ is a ramp signal.

At time $t_5$, compensation signal $V_{COMP}$ becomes substantially equal to voltage $V_{RPM}$, which causes comparator 50 to generate a logic high voltage at output 54. In response to the logic high voltage appearing at output 54, a logic high voltage appears at output 64 of latch 60 and a logic low voltage appears at output 62 of latch 60. Accordingly, pulse signal DUTY_150 transitions to a logic low voltage level.

Between times $t_5$ and $t_6$, a logic high voltage level appears at output terminal 64, i.e., at the Qbar output, of latch 60 and a logic low voltage level appears at output terminal 62, i.e., at the Q output, of latch 60. The logic high voltage level at output terminal 64 appears at the gate terminal of transistor 66 and turns it on. Thus the voltage at input terminal 18C, i.e., the noninverting input terminal of comparator 50, is substantially equal to voltage $V_B$ and capacitor 68 is discharged to make voltage $V_{RPM}$ at input terminal 18C substantially equal to that at input terminal 18A. Because voltage $V_{RPM}$ is less than voltage $V_{COMP}$ between times $t_5$ and $t_6$, comparator 50 generates a logic low voltage at output terminal 54.

In response to voltage $V_{COMP}$ increasing and becoming greater than voltage $V_{RPM1}$ at time $t_6$, comparator 52 generates a logic high voltage at its output, which signal is transferred via output terminal 56 to the set input terminal of latch 60 and causes the signal at the Q output terminal to transition to a logic high voltage level.

Figure 6:
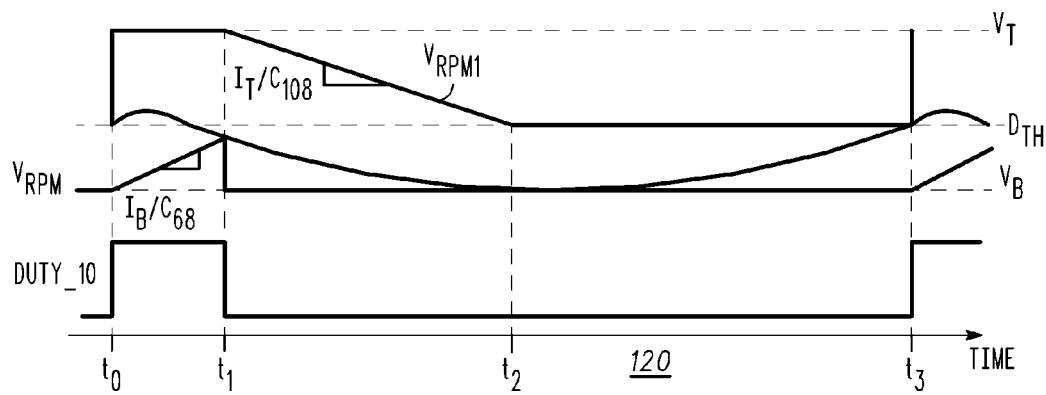
FIG. 6 is a timing diagram of circuit parameters of the ramp pulse modulation stage of FIG. 2 in accordance with an embodiment of the present invention.

FIG. 6 is a timing diagram 120 of pulse ramp modulator 18 operating in Discontinuous Conduction Mode (DCM) mode. In operation, input signals $V_{COMP}$, $D_{TH}$, $V_B$, $V_{RPM}$, $V_{RPM1}$, and $V_T$ appear at input terminals 18A, 18B, 18D, 18C, 18E, and 18F, respectively, of pulse ramp modulator 18 (shown in FIGS. 1 and 2). Current source 70 is connected between input terminals 18D and 18C (shown in FIGS. 1 and 2). In response to the input signal at the control electrode of transistor 66 the current flowing through current source 70 sources a current $I_B$ and in response to current $I_B$ signal $V_{RPM}$ appears at the noninverting input terminal of comparator 50, i.e., input terminal 18C. Current source 110 is connected between input terminals 18E and 18F and in response to the input signal at the control electrode of transistor 106 current source 110 sources a current $I_T$ which is used to generate a voltage signal $V_{RPM1}$ at the inverting input terminal of comparator 52, i.e., input terminal 18E. FIG. 6 is a timing diagram showing signals $V_{COMP}$, $V_B$, $D_{TH}$, $V_{RPM}$, $V_{RPM1}$, $V_T$, and pulse signal DUTY_10. Referring now to FIGS. 1 and 2, before time $t_0$, a logic high voltage level appears at output terminal 64, i.e., at the Qbar output terminal, of latch 60 and a logic low voltage level appears at output terminal 62, i.e., at the Q output terminal, of latch 60. The logic high voltage level at output terminal 64 appears at the gate terminal of transistor 66 and turns it on. Thus voltage $V_{RPM}$ at input terminal 18C, i.e., the noninverting input terminal of comparator 50, is substantially equal to voltage $V_B$ and capacitor 68 is charged to a voltage substantially equal to voltage $V_B$. Because voltage $V_{RPM}$ is less than voltage $V_{COMP}$ before time $t_0$, comparator 50 generates a logic low voltage at output terminal 64. As the time approaches time $t_0$ from a time before time $t_0$, voltage $V_{RPM1}$ is clamped at voltage level $D_{TH}$.

In response to voltage $V_{COMP}$ increasing and crossing through voltage level $D_{TH}$ at time $t_0$, comparator 52 generates a logic high voltage at its output, which signal is transferred via output terminal 56 to the set input terminal of latch 60 and causes the signal at Q output terminal 62, i.e., output terminal 18G, to transition to a logic high voltage level. It should be noted that Q output terminal 62 of latch 60 serves as output terminal 18G of ramp pulse modulator 18 and the signal at Q output terminal 62 serves as a pulse signal DUTY_10 that is transmitted to the input terminal of drive circuit 12.

The logic high voltage at output terminal 62 turns on transistor 106, which sets voltage $V_{RPM1}$ at input terminal 18E to a voltage substantially equal to voltage $V_T$. In addition, latch 60 generates a logic low voltage at output terminal 64 which turns off transistor 66. Current source 70 sources a current $I_B$ which charges capacitor 68 such that voltage $V_{RPM}$ at input terminal 18C, i.e., at the noninverting input terminal of comparator 50, increases at a rate of approximately $I_B/C_{68}$ volts per second. Thus, voltage $V_{RPM}$ at the noninverting input terminal of comparator 50 is a ramp signal having a slope of approximately $I_B/C_{68}$.

At time $t_1$, voltage $V_{COMP}$ crosses through the voltage level of voltage $V_{RPM}$ and after time $t_1$ becomes less than voltage $V_{RPM}$. In response to voltage $V_{COMP}$ becoming less than voltage $V_{RPM}$ and the logic low voltage level at the set input terminal of latch 60, a logic low voltage level appears at output terminal 62, which turns off transistor 106. Current source 110 sources a current $I_T$ which charges capacitor 108 such that voltage $V_{RPM1}$ at input terminal 18E, i.e., at the inverting input terminal of comparator 52, decreases at a rate of approximately $I_T/C_{108}$ volts per second. Thus, voltage $V_{RPM1}$ at the noninverting input terminal of comparator 52 is a substantially constant voltage from approximately time $t_0$ to approximately time $t_1$, a ramp signal from approximately time $t_1$ to approximately time $t_2$ having a negative slope of $I_T/C_{108}$, and a substantially constant voltage signal from approximately time $t_2$ to approximately time $t_3$. Pulse signal DUTY_10 appearing at output terminal 62 transitions to a logic low voltage level at time $t_1$. The duration of pulse signal DUTY_10 being at a logic high voltage is substantially equal to the duration of the ramp portion of voltage $V_{RPM}$. The duration of pulse signal DUTY_10 being at a logic low voltage is substantially equal to the sum of the time for the ramp portion of voltage $V_{RPM1}$ and the time at which voltage $V_{RPM1}$ is at voltage level $D_{TH}$.

Between times $t_1$ and $t_2$, a logic high voltage level appears at output terminal 64, i.e., at the Qbar output terminal, of latch 60 and a logic low voltage level appears at output terminal 62, i.e., at Q output terminal 62, of latch 60. The logic high voltage level at output terminal 64 appears at the gate terminal of transistor 66 and turns it on. Thus voltage $V_{RPM}$ at input terminal 18C, i.e., the noninverting input terminal of comparator 50, is substantially equal to voltage $V_B$ and capacitor 68 is charged to a voltage substantially equal to voltage $V_B$. Because voltage $V_{RPM}$ is less than voltage $D_{TH}$ between times $t_1$ and $t_2$, comparator 50 generates a logic low voltage at output terminal 54. In response to voltage $V_{COMP}$ increasing and crossing through voltage level $D_{TH}$ at time $t_3$, comparator 52 generates a logic high voltage at its output, which signal is transferred via output terminal 56 to the set input terminal of latch 60. In response to the logic high voltage at the set input terminal of latch 60, the signal at Q output terminal 62 transitions to a logic high voltage level. Accordingly, pulse signal DUTY_10 transitions to a logic high voltage level. As noted above, Q output terminal 62 of latch 60 serves as output terminal 18G of ramp pulse modulator 18 and the signal at Q output terminal 62 serves as a pulse signal DUTY_10 that is transmitted to the input terminal of drive circuit 12.

In response to voltage $V_{RPM1}$ decreasing and becoming less to voltage $D_{TH}$ at time $t_2$, diode 116 turns on, which clamps voltage $V_{RPM1}$ at a voltage substantially equal to voltage $D_{TH}$. It should be noted that voltage $V_{RPM1}$ is clamped at a voltage level substantially equal to voltage $D_{TH}$ less the voltage across diode 116.

From about time $t_2$ to about time $t_3$, current source 110 sources a current $I_T$ which discharges capacitor 108. At about time $t_3$, the voltage at the inverting input of comparator 52 becomes less that the voltage at its noninverting input, which causes comparator 52 to generate a logic high voltage at output 56. In response to the logic high voltage, latch 60 generates a logic high voltage at output 62, which turns on transistor 106 and causes voltage $V_{RPM1}$ to transistor to voltage level $V_T$. In addition, latch 60 generates a logic low voltage at output 64 which turns off transistor 66. In response to transistor 66 being off, current source 70 sources a current $I_B$ which charges capacitor 68 such that voltage $V_{RPM}$ at input terminal 18C, i.e., at the noninverting input terminal of comparator 50, increases at a rate of approximately $I_B/C_{68}$ volts per second. Thus, voltage $V_{RPM}$ at the noninverting input terminal of comparator 50 is a ramp signal having a slope of approximately $I_B/C_{68}$.

Figure 7:
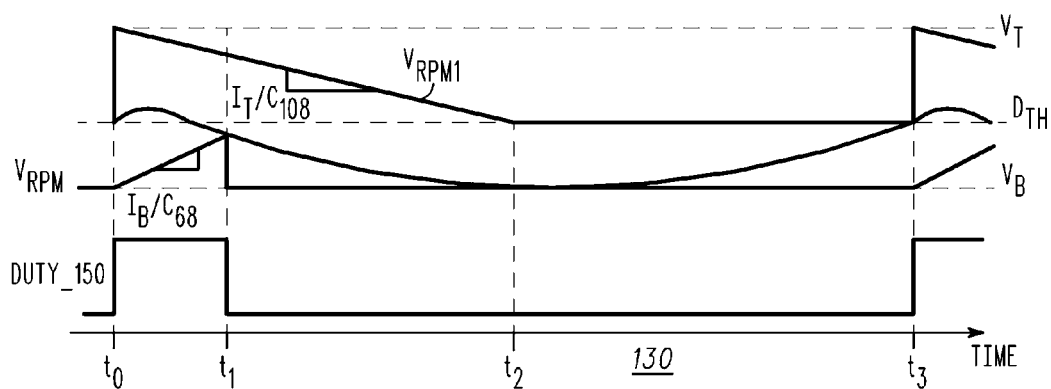
FIG. 7 is a timing diagram of circuit parameters of the ramp pulse modulation stage of FIG. 4 in accordance with an embodiment of the present invention.

FIG. 7 is a timing diagram 130 of pulse ramp modulator 102 operating in Discontinuous Conduction Mode (DCM) mode. In operation, input signals $V_{COMP}$, $D_{TH}$, $V_B$, $V_{RPM}$, and $V_{RPM1}$, $V_T$ appear at input terminals 18A, 18B, 18D, 18C, 18E, and 18F, respectively, of pulse ramp modulator 18 (shown in FIGS. 1 and 2). Current source 70 is connected between input terminals 18D and 18C. In response to the input signal at the control electrode of transistor 66 the current flowing through current source 70 sources a current $I_B$ and in response to current $I_B$ signal $V_{RPM}$ appears at the noninverting input terminal of comparator 50, i.e., input terminal 18C. Current source 110 is connected between input terminals 18E and 18F and in response to the input signal at the control electrode of transistor 106 current source 110 sources a current $I_T$ which is used to generate a voltage signal $V_{RPM1}$ at the inverting input terminal of comparator 52, i.e., input terminal 18E. FIG. 7 is a timing diagram showing signals $V_{COMP}$, $V_B$, $D_{TH}$, $V_{RPM}$, $V_{RPM1}$, $V_T$, and pulse signal DUTY_150. Before time $t_0$, a logic high voltage level appears at output terminal 64, i.e., at the Qbar output terminal, of latch 60 and a logic low voltage level appears at output terminal 62, i.e., at the Q output terminal, of latch 60. The logic high voltage level at output terminal 64 appears at the gate terminal of transistor 66 and turns it on. Thus voltage $V_{RPM}$ at input terminal 18C, i.e., the noninverting input terminal of comparator 50, is substantially equal to voltage $V_B$ and capacitor 68 is charged to a voltage substantially equal to voltage $V_B$. Because voltage $V_B$ is less than voltage $V_{COMP}$ before time $t_0$, comparator 50 generates a logic low voltage at output terminal 64. As the time approaches time $t_0$ from a time before time $t_0$, voltage $V_{RPM1}$ is clamped at voltage level $D_{TH}$.

In response to voltage $V_{COMP}$ increasing and crossing through voltage level $D_{TH}$ at time $t_0$, comparator 52 generates a logic high voltage at its output, which signal is transferred via output terminal 56 to the set input terminal of latch 60. In response to the logic high voltage at the set input terminal of latch 60, the signal at Q output terminal 62, i.e., output terminal 18G, transitions to a logic high voltage level. It should be noted that Q output terminal 62 of latch 60 serves as output terminal 18G of ramp pulse modulator 18 and the signal at Q output terminal 62 serves as a pulse signal DUTY_150 that is transmitted to the input terminal of drive circuit 12.

The logic high voltage at output terminal 62 triggers one shot 152, which turns on transistor 106 for a predefined period, setting voltage $V_{RPM1}$ at input terminal 18E to a voltage substantially equal to voltage $V_T$. It should be noted that timing diagram 130 is drawn under the assumption that the duration of one shot 152 is very short compared to the time between times $t_0$ and $t_3$. Thus, signal $V_{RPM1}$ shown in FIG. 7 appears to decrease beginning at time $t_0$. This assumption was not made with reference to FIG. 5. In addition, the logic high voltage at output terminal 62 causes latch 60 to generate a logic low voltage at output terminal 64 which turns off transistor 66. Current source 70 sources a current $I_B$ which charges capacitor 68 such that voltage $V_{RPM}$ at input terminal 18C, i.e., at the noninverting input terminal of comparator 50, increases at a rate of approximately $I_B/C_{68}$ volts per second. Thus, voltage $V_{RPM}$ at the noninverting input terminal of comparator 50 is a ramp signal having a slope of $I_B/C_{68}$.

At time $t_1$, voltage $V_{COMP}$ crosses through the voltage level of voltage $V_{RPM}$ and after time $t_1$ becomes less than voltage $V_{RPM}$. In response to voltage $V_{COMP}$ becoming less than voltage $V_{RPM}$, and the logic low voltage level at the set input terminal of latch 60, a logic low voltage level appears at output terminal 62, which turns off transistor 106. Current source 110 sources a current $I_T$ which charges capacitor 108 such that voltage $V_{RPM1}$ at input terminal 18E, i.e., at the inverting input terminal of comparator 52, decreases at a rate of approximately $I_T/C_{108}$ volts per second. Thus, voltage $V_{RPM1}$ at the noninverting input terminal of comparator 52 is a ramp signal from approximately time $t_0$ to approximately time $t_2$ having a negative slope of approximately $I_T/C_{108}$ and a substantially constant voltage signal from approximately time $t_2$ to approximately time $t_3$. Pulse signal DUTY_150 appearing at output terminal 62 transitions to a logic low voltage level at time $t_1$. The duration of pulse signal DUTY_150 being at a logic high voltage is substantially equal to the duration of the ramp portion of voltage $V_{RPM}$. The duration of pulse signal DUTY_150 being at a logic low voltage is substantially equal to the sum of the time for the ramp portion of voltage $V_{RPM1}$ and the time at which voltage $V_{RPM1}$ is at voltage level $D_{TH}$.

Between times $t_0$ and $t_2$, a logic high voltage level appears at output terminal 64, i.e., at the Qbar output terminal, of latch 60 and a logic low voltage level appears at output terminal 62, i.e., at Q output terminal 62, of latch 60. The logic high voltage level at output terminal 64 appears at the gate terminal of transistor 66 and turns it on. Thus voltage $V_{RPM}$ at input terminal 18C, i.e., the noninverting input terminal of comparator 50, is substantially equal to voltage $V_B$ and capacitor 68 is charged to a voltage substantially equal to voltage $V_B$. Because voltage $V_{RPM}$ is less than voltage $V_{COMP}$ between times $t_1$ and $t_2$, comparator 50 generates a logic low voltage at output terminal 54. In response to voltage $V_{COMP}$ increasing and crossing through voltage level $D_{TH}$ at time $t_3$, comparator 52 generates a logic high voltage at its output, which signal is transferred via output terminal 56 to the set input terminal of latch 60. In response to the logic high voltage at the set input terminal of latch 60, the signal at Q output terminal 62 transitions to a logic high voltage level. As noted above, Q output terminal 62 of latch 60 serves as output terminal 18G of ramp pulse modulator 18 and the signal at Q output terminal 62 serves as a pulse signal DUTY_150 that is transmitted to the input terminal of drive circuit 12.

In response to voltage $V_{RPM1}$ decreasing and becoming less to voltage $D_{TH}$ at time $t_2$, diode 116 turns on, which clamps voltage $V_{RPM1}$ at a voltage substantially equal to voltage $D_{TH}$. It should be noted that voltage $V_{RPM1}$ is clamped at a voltage level substantially equal to voltage $D_{TH}$ less the voltage across diode 116.

From about time $t_2$ to about time $t_3$, current source 110 sources a current $I_T$ which discharges capacitor 108. At about time $t_3$, the voltage at the inverting input of comparator 52 becomes less that the voltage at its noninverting input, which causes comparator 52 to generate a logic high voltage at output 56. In response to the logic high voltage, latch 60 generates a logic high voltage at output 62, which turns on transistor 106 and causes voltage $V_{RPM1}$ to transistor to voltage level $V_T$. In addition, latch 60 generates a logic low voltage at output 64 which turns off transistor 66. In response to transistor 66 being off, current source 70 sources a current $I_B$ which charges capacitor 68 such that voltage $V_{RPM}$ at input terminal 18C, i.e., at the noninverting input terminal of comparator 50, increases at a rate of approximately $I_B/C_{68}$ volts per second. Thus, voltage $V_{RPM}$ at the noninverting input terminal of comparator 50 is a ramp signal having a slope of approximately $I_B/C_{68}$.

In response to voltage $V_{COMP}$ becoming substantially equal to signal $V_{RPM}$ at time $t_1$ in timing diagrams 115 (FIG. 3), 120 (FIG. 6), 130 (FIG. 7) and at time $t_2$ in timing diagram 155 (FIG. 5), signal $V_{RPM}$ resets to its minimum. In response to voltage $V_{COMP}$ becoming substantially equal to signal $V_{RPM1}$, signal $V_{RPM}$ increases and signal $V_{RPM1}$ sets to its maximum value. This inhibits signal $V_{COMP}$ from re-triggering the turn on signal and thereby inhibiting the generation of a double pulse.

Figure 8:
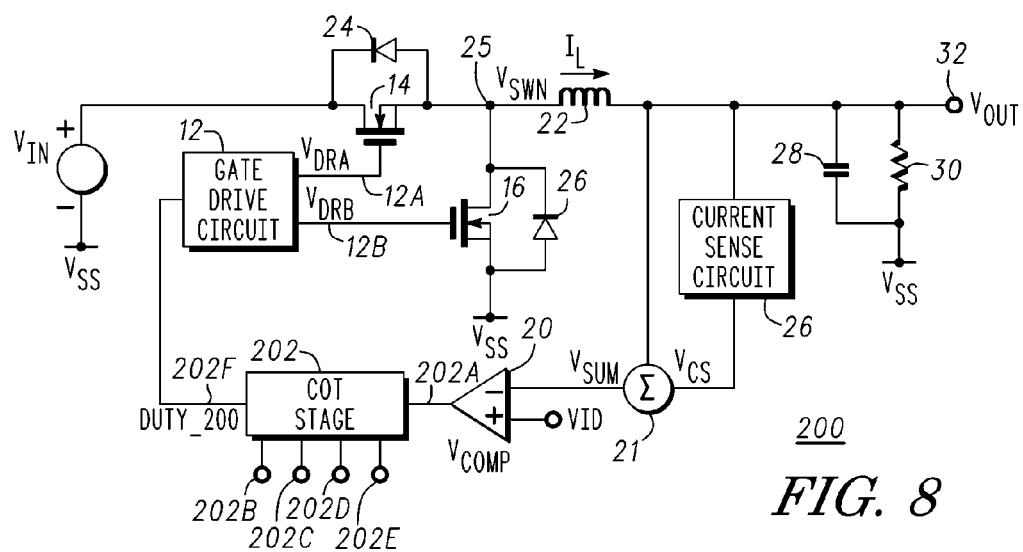
FIG. 8 is a circuit schematic of a converter that includes a constant-on-time modulation stage in accordance with an embodiment of the present invention.

FIG. 8 is a circuit schematic of a voltage regulator 200 in accordance with an embodiment of the present invention. Like voltage regulator 10, voltage regulator 200 includes a drive circuit 12, switching devices 14 and 16, compensation circuit 20, inductor 22, summer 21, current sense circuit 26, load capacitor 28, and load 30. Voltage regulator 200 includes a constant-on-time (COT) modulator 202 instead of a pulse ramp modulator as shown in FIG. 1. Constant-on-time modulator 202 has input terminals 202A, 202B, 202C, 202D, and 202E, and an output terminal 202F. Similar to ramp pulse modulator 18 shown in FIG. 1, constant-on-time modulator 202 is configured to operate in response to a compensation signal and to generate a pulse signal DUTY_200. Thus, the configuration of voltage regulator 200 is similar to that of voltage regulator 10.

Figure 9:
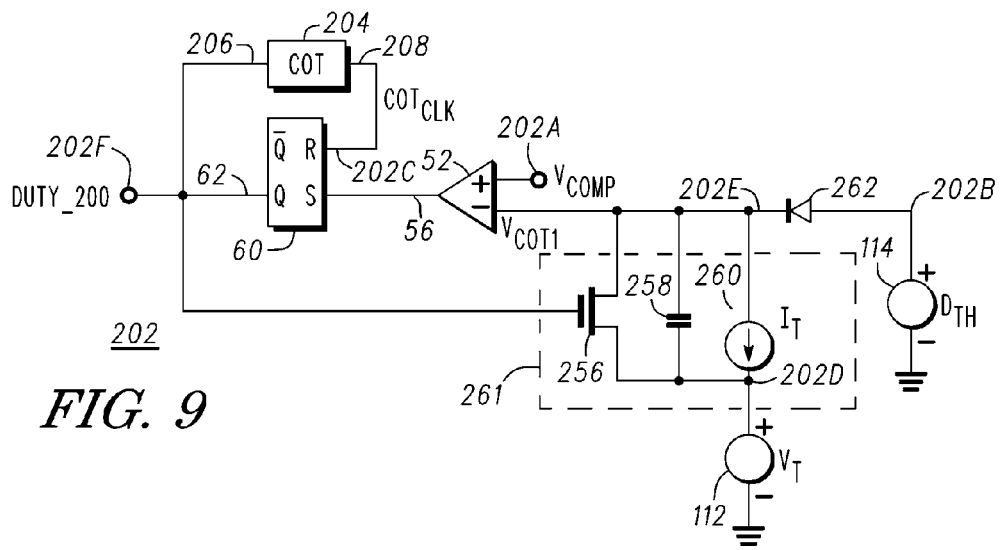
FIG. 9 is circuit schematic of a constant-on-time modulation stage in accordance with an embodiment of the present invention.

FIG. 9 is a circuit schematic of constant-on-time modulator 202 in accordance with an embodiment of the present invention. Constant-on-time modulator 202 comprises a comparator 52 which has a noninverting input terminal, an inverting input terminal, and an output terminal 56. The inverting input terminal of comparator 52 is coupled for receiving a constant-on-time modulation signal $V_{COT1}$ and the noninverting input terminal is coupled for receiving compensation signal $V_{COMP}$. The noninverting input terminal of comparator 52 serves as an input terminal 202A. Output terminal 56 is connected to the set input terminal of latch 60. The Q output terminal 62 of latch 60 is connected to the reset input terminal of latch 60 through a constant-on-time feedback network 204. Constant-on-time feedback network 204 has an input terminal 206 and an output terminal 208, where input terminal 206 is connected to output terminal 62 of latch 60. Output terminal 208 is connected to the reset input terminal of latch 60 wherein the connection forms input terminal 202C. By way of example, constant-on-time feedback network 204 may be comprised of a one shot coupled to a timer, wherein input terminal 206 serves as the input terminal of the one shot and output terminal 208 serves as the output terminal of the timer.

In addition, Q output terminal 62 of latch 60 is connected to a transistor 256, which has a control electrode and a pair of current carrying electrodes. By way of example the control electrode is a gate electrode or gate terminal and the current carrying electrodes include a source electrode or terminal and a drain electrode or terminal. The source terminal of transistor 256 is commonly connected to a terminal of capacitor 258 and to the inverting input terminal of comparator 52 to form a node that can serve as input terminal 202E. A constant-on-time modulation signal $V_{COT1}$ appears at the inverting input terminal of comparator 52. The drain terminal of transistor 256 is connected to the other terminal of capacitor 258 to form a node that may serve as input terminal 202D. A current source 206 is connected between input terminals 202E and 202D and a voltage source 112 is connected to input terminal 202D. Transistor 256, capacitor 258, and current source 260 may be referred to as a ramp generation circuit 261. A diode 262 has a cathode connected to input terminal 202E and an anode that serves as input terminal 202B. A voltage source 114 is coupled to input terminal 202B. Voltage source 112 provides a voltage $V_T$ and voltage source 114 provides a voltage $D_{TH}$.

Output terminal 62 of latch 60, input terminal 206 of constant-on-time feedback network 204, and the gate electrode of transistor 256 form output terminal 202F, which is connected to the input terminal of drive circuit 12 (shown in FIG. 8).

In operation, input signal $V_{COMP}$ is coupled to input terminal 202A and voltage $V_{COT1}$ is formed at terminal 202E of constant-on-time modulator 202 (shown in FIGS. 8 and 9).

Figure 10:
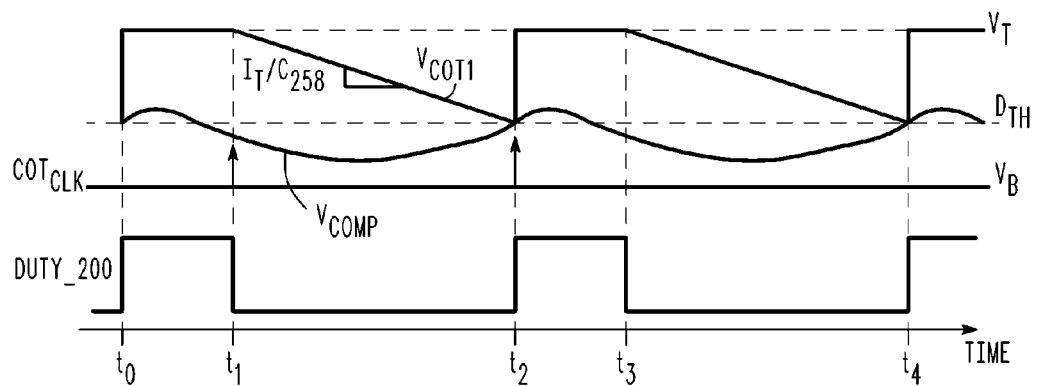
FIG. 10 is a timing diagram of circuit parameters of the constant-on-time modulation stage of FIG. 9 in accordance with an embodiment of the present invention.

FIG. 10 is a timing diagram 212 showing signals $V_{COMP}$, $D_{TH}$, impulse signal $COT_{CLK}$ that appears at input terminal 202C, signal $V_{COT1}$ that appears at input terminal 202E, and pulse signal DUTY_200 that appears at output terminal 202F.

Referring now to FIGS. 9 and 10, before time $t_0$ voltage $V_{COMP}$ is less than voltage $V_{COT1}$, voltage $V_{COT1}$ approaches voltage level $D_{TH}$, and the voltage at output 62 is at a logic low voltage level. Thus, transistor 256 is off. In response to compensation signal $V_{COMP}$ being substantially equal to voltage $D_{TH}$ at time $t_0$, comparator 52 generates a logic high voltage at output 56, which is latched by latch 60 to output 62. Thus, pulse signal DUTY_200 transitions to a logic high voltage level. The logic high voltage at output 62 appears at the gate electrode of transistor 256 and turns it on, which causes voltage $V_{COT1}$ to transition to voltage level $V_T$.

At about time $t_1$, the logic high voltage at output 62 triggers the one shot of constant-on-time modulator 204, which generates an impulse signal $COT_{CLK}$. In response to impulse signal $COT_{CLK}$ at input 202C, latch 60 generates logic low output signal at output 62. The logic low output voltage at output 62 turns off transistor 256. Current source 260 sources a current $I_T$ which charges capacitor 258 such that voltage $V_{COT1}$ at input terminal 202E, i.e., at the inverting input terminal of comparator 52, decreases at a rate of approximately $I_T/C_{258}$ volts per second. Thus, voltage $V_{COT1}$ at the noninverting input terminal of comparator 52 is a substantially constant voltage from approximately time $t_0$ to approximately time $t_1$ and a ramp signal from approximately time $t_1$ to approximately time $t_2$ having a negative slope of $I_T/C_{258}$, where $I_T$ is the current sourced by current source 260 and $C_{258}$ is the capacitance value of capacitor 258. Pulse signal DUTY_200 appearing at output terminal 62 transitions to a logic low voltage level at time $t_1$. The duration of pulse signal DUTY_200 being at a logic high voltage is substantially equal to the duration of the constant voltage portion of voltage $V_{COT1}$. The duration of pulse signal DUTY_200 being at a logic low voltage is substantially equal to the ramp portion of voltage $V_{COT1}$.

It should be noted that timing diagram 212 is drawn under the assumption that the duration of the one shot is very short compared to the time between times $t_0$ and $t_2$. Thus, signal $V_{COT1}$ shown in FIG. 10 appears to decrease beginning at time $t_1$.

At time $t_2$ and in response to compensation signal $V_{COMP}$ being substantially equal to voltage $D_{TH}$, comparator 52 generates a logic high voltage at output 56, which is latched by latch 60 to output 62. Thus, pulse signal DUTY_200 transitions to a logic high voltage level. The logic high voltage at output 62 appears at the gate electrode of transistor 256 and turns it on, which causes voltage $V_{COT1}$ to transition to voltage level $V_T$.

At about time $t_3$, the logic high voltage at output 62 triggers the one shot of constant-on-time modulator 204, which generates an impulse signal $COT_{CLK}$. In response to impulse signal $COT_{CLK}$ at input 202C, latch 60 generates logic low output signal at output 62. The logic low output voltage at output 62 turns off transistor 256. Current source 260 sources a current $I_T$ which charges capacitor 258 such that voltage $V_{COT1}$ at input terminal 202E, i.e., at the inverting input terminal of comparator 52, decreases at a rate of approximately $I_T/C_{258}$ volts per second. Thus, voltage $V_{COT1}$ at the noninverting input terminal of comparator 52 is a substantially constant voltage from approximately time $t_2$ to approximately time $t_3$ and a ramp signal from approximately time $t_3$ to approximately time $t_4$ having a negative slope of $I_T/C_{258}$. Pulse signal DUTY_200 appearing at output terminal 62 transitions to a logic low voltage level at time $t_3$. The duration of pulse signal DUTY_200 being at a logic high voltage is substantially equal to the duration of the constant voltage portion of voltage $V_{COT1}$. The duration of pulse signal DUTY_200 being at a logic low voltage is substantially equal to the ramp portion of voltage $V_{COT1}$.

At time $t_4$ and in response to compensation signal $V_{COMP}$ being substantially equal to voltage $D_{TH}$, comparator 52 generates a logic high voltage at output 56, which is latched by latch 60 to output 62. Thus, pulse signal DUTY_200 transitions to a logic high voltage level. The logic high voltage at output 62 appears at the gate electrode of transistor 256 and turns it on, which causes voltage $V_{COT1}$ to transition to voltage level $V_T$.

Figure 11:
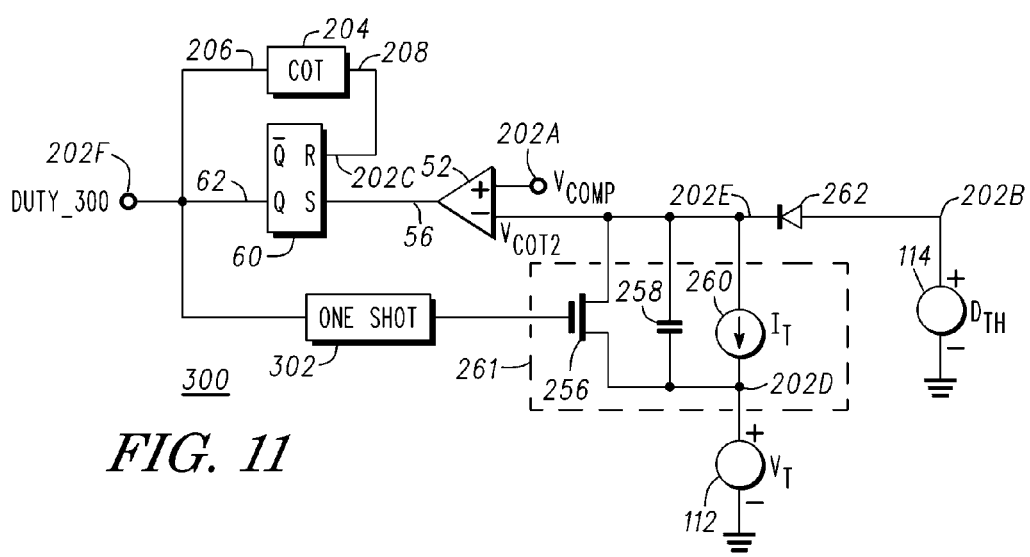
FIG. 11 is circuit schematic of a constant-on-time modulation stage in accordance with an embodiment of the present invention.

FIG. 11 is a circuit schematic of constant-on-time modulator 300 in accordance with an embodiment of the present invention. It should be noted that the input/output configuration of constant-on-time modulator 300 may be the same as that of constant-on-time modulator 202. Thus, constant-on-time modulator 202 can be replaced by constant-on-time modulator 300. It should be further noted that the operation of voltage regulator 200 described with reference to FIG. 8 may also apply to embodiments in which constant-on-time modulator 300 replaces constant-on-time modulator 202. Constant-on-time modulator 300 comprises comparator 52, latch 60, constant-on-time regulator 204, transistor 256, capacitor 258, and diode 262 as described with reference to FIG. 9. In addition, constant-on-time modulator 300 includes a one shot 302 connected between output terminal 62 and the gate of transistor 256.

A voltage source 112 is connected to input terminal 202D, a voltage source 114 is connected to input terminal 202B, and a current source 260 is connected between input terminals 202E and 202D.

Output terminal 202F is connected to the input terminal of drive circuit 12 (shown in FIG. 4).

Figure 12:
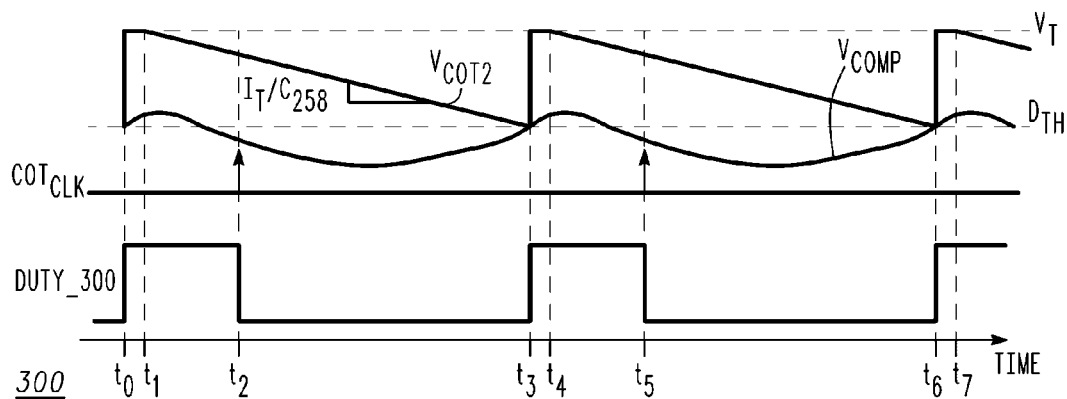
FIG. 12 is a timing diagram of circuit parameters of the constant-on-time modulation stage of FIG. 11 in accordance with an embodiment of the present invention.

In operation, input signal $V_{COMP}$ is coupled to input terminal 202A and voltage $V_{COT2}$ is formed at terminal 202E of constant-on-time modulator 202 (shown in FIGS. 8 and 11). FIG. 12 is a timing diagram 300 showing signals $V_{COMP}$, $D_{TH}$, impulse signal $COT_{CLK}$ that appears at input terminal 202C, ramp signal $V_{COT2}$ that appears at input terminal 202E, and pulse signal DUTY_300 that appears at output terminal 202F. Referring now to FIGS. 11 and 12, before time $t_0$ voltage $V_{COMP}$ is less than voltage $V_{COT2}$, voltage $V_{COT2}$ approaches voltage level $D_{TH}$, and the voltage at output 62 is at a logic low voltage level. Thus, transistor 256 is off. In response to compensation signal $V_{COMP}$ Wow being substantially equal to voltage $D_{TH}$ at time $t_0$, comparator 52 generates a logic high voltage at output 56, which is latched by latch 60 to output 62. Thus, pulse signal DUTY_300 transitions to a logic high voltage level.

The logic high voltage level at output terminal 62 appears at the input terminal of one shot 302 and triggers one shot 302. Thus, a logic high voltage appears at the control electrode of transistor 256, turning on transistor 256, which sets voltage $V_{COT2}$ at input node 202E to a voltage substantially equal to voltage $V_T$.

One shot 302 creates at logic high voltage at the control electrode of transistor 106 for a fixed period of time. This fixed time period ends at time $t_1$. Thus, at time $t_1$ one shot 302 reverts to its stable state which turns off transistor 106. Current source 260 sources a current $I_T$ which charges capacitor 258 such that the voltage at input terminal 202E, i.e., at the inverting input terminal of comparator 52, decreases at a rate of approximately $I_T/C_{258}$ volts per second. Thus, the voltage $V_{COT1}$ at the noninverting input terminal of comparator 52 is a substantially constant voltage from approximately time $t_0$ to approximately time $t_1$ and is a ramp signal from approximately time $t_1$ to approximately time $t_3$ and has a negative slope of $I_T/C_{108}$.

At about time $t_2$, the logic high voltage at output 62 triggers the one shot of constant-on-time modulator 204, which generates an impulse signal $COT_{CLK}$. In response to impulse signal $COT_{CLK}$ at input 202C, latch 60 generates logic low output signal at output 62. Thus, pulse signal DUTY_300 transitions to a logic low voltage level at time $t_2$. Voltage $V_{COT2}$ at the noninverting input terminal of comparator 52 is a substantially constant voltage from approximately time $t_0$ to approximately time $t_1$ and a ramp signal from approximately time $t_1$ to approximately time $t_3$ having a negative slope of $I_T/C_{258}$.

In response to compensation signal $V_{COMP}$ being substantially equal to voltage $D_{TH}$ at time $t_3$, comparator 52 generates a logic high voltage at output 56, which is latched by latch 60 to output 62. Thus, pulse signal DUTY_300 transitions to a logic high voltage level.

The logic high voltage level at output terminal 62 appears at the input terminal of one shot 302 and triggers one shot 302. Thus, a logic high voltage appears at the control electrode of transistor 256, turning on transistor 256, which sets voltage $V_{COT2}$ at input node 202E to a voltage substantially equal to voltage $V_T$.

One shot 302 creates at logic high voltage at the control electrode of transistor 106 for a fixed period of time. This fixed time period ends at time $t_4$. Thus, at time $t_4$ one shot 302 reverts to its stable state which turns off transistor 106. Current source 260 sources a current $I_T$ which charges capacitor 258 such that the voltage at input terminal 202E, i.e., at the inverting input terminal of comparator 52, decreases at a rate of approximately $I_T/C_{258}$ volts per second. Thus, the voltage $V_{COT2}$ at the noninverting input terminal of comparator 52 is a substantially constant voltage from approximately time $t_3$ to approximately time $t_4$ and is a ramp signal from approximately time $t_1$ to approximately time $t_4$ and has a negative slope of $I_T/C_{108}$.

At about time $t_5$, the logic high voltage at output 62 triggers the one shot of constant-on-time modulator 204, which generates an impulse signal $COT_{CLK}$. In response to impulse signal $COT_{CLK}$ at input 202C, latch 60 generates a logic low output signal at output 62. Thus, pulse signal DUTY_300 transitions to a logic low voltage level at time $t_5$. Voltage $V_{COT2}$ at the noninverting input terminal of comparator 52 is a substantially constant voltage from approximately time $t_3$ to approximately time $t_4$ and a ramp signal from approximately time $t_4$ to approximately time $t_6$ having a negative slope of $I_T/C_{258}$.

In response to compensation signal $V_{COMP}$ being substantially equal to voltage $D_{TH}$ at time $t_6$, comparator 52 generates a logic high voltage at output 56, which is latched by latch 60 to output 62. Thus, pulse signal DUTY_300 transitions to a logic high voltage level.

The logic high voltage level at output terminal 62 appears at the input terminal of one shot 302 and triggers one shot 302. Thus, a logic high voltage appears at the control electrode of transistor 256, turning on transistor 256, which sets voltage $V_{COT2}$ at input node 202E to a voltage substantially equal to voltage $V_T$.

One shot 302 creates at logic high voltage at the control electrode of transistor 106 for a fixed period of time. This fixed time period ends at time $t_7$. Thus, at time $t_7$ one shot 302 reverts to its stable state which turns off transistor 106. Current source 260 sources a current $I_T$ which charges capacitor 258 such that the voltage at input terminal 202E, i.e., at the inverting input terminal of comparator 52, decreases at a rate of approximately $I_T/C_{258}$ volts per second. Thus, the voltage $V_{COT2}$ at the noninverting input terminal of comparator 52 is a substantially constant voltage from approximately time $t_6$ to approximately time $t_7$ and is a ramp signal beginning at approximately time $t_7$.

Figure 13:
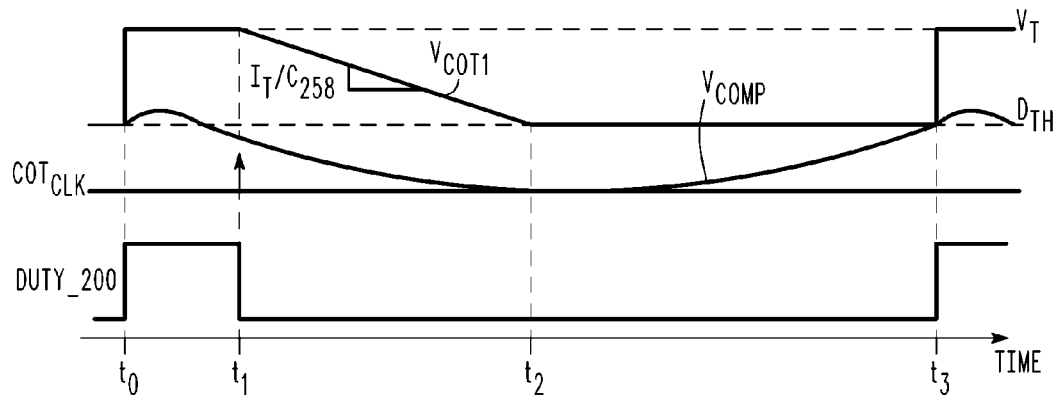
FIG. 13 is a timing diagram of circuit parameters of the constant-on-time modulation stage of FIG. 9 in accordance with an embodiment of the present invention.

FIG. 13 is a timing diagram 350 of pulse ramp modulator 202 operating in Discontinuous Conduction Mode (DCM). The operation is similar to that described for constant-on-time modulator 202 with reference to FIGS. 9 and 10, except that at time $t_2$ in timing diagram 350 diode 262 turns on and clamps signal $V_{COT2}$ at voltage level $D_{TH}$. In response to signal $V_{COT2}$ becoming less than voltage $D_{TH}$. It should be appreciated that signal $V_{COT2}$ may be clamped at a voltage substantially equal to a diode voltage drop less than voltage $D_{TH}$. Similar to the operation shown in timing diagram 212 of FIG. 10, in response to compensation signal $V_{COMP}$ being substantially equal to voltage $D_{TH}$ at time $t_2$, comparator 52 generates a logic high voltage at output 56, which is latched by latch 60 to output 62. Thus, pulse signal DUTY_200 transitions to a logic high voltage level. The logic high voltage at output 62 appears at the gate electrode of transistor 256 and turns it on, which causes voltage $V_{COT1}$ to transition to voltage level $V_T$.

Figure 14:
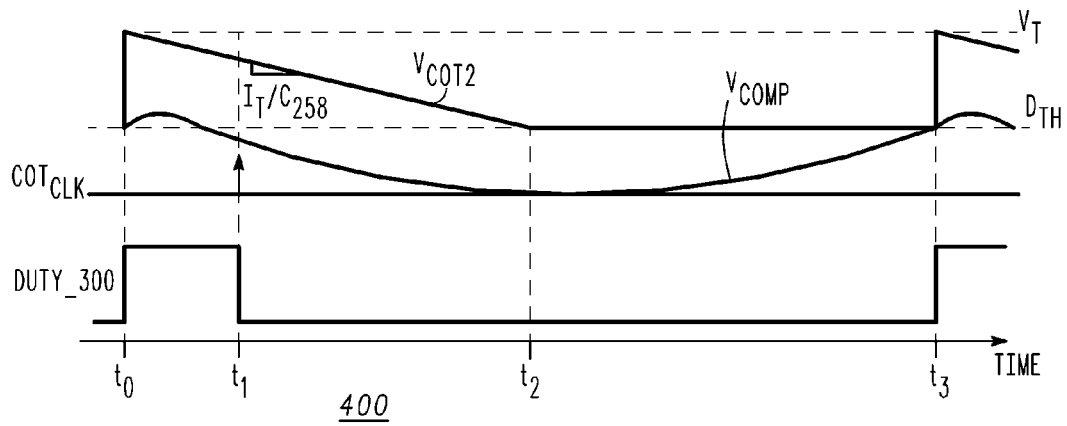
FIG. 14 is a timing diagram of circuit parameters of the constant-on-time modulation stage of FIG. 11 in accordance with an embodiment of the present invention.

FIG. 14 is a timing diagram 400 of pulse ramp modulator 300 operating in Discontinuous Conduction Mode (DCM). The operation is similar to that described for pulse ramp modulator 300 with reference to FIGS. 11 and 12, except that in response to pulse signal DUTY_300 transitioning to a logic high state, signal $V_{COT2}$ transitions to voltage level $V_T$ and begins to decrease at a rate of $I_T/C_{258}$ volts per second. It should be noted that timing diagram 400 is drawn under the assumption that the duration of one shot 302 is very short compared to the time between times $t_0$ and $t_3$. Thus, signal $V_{COT2}$ shown in FIG. 14 appears to decrease beginning at time $t_0$.

By now it should be appreciated that a switching power supply controller and a method for controlling the switching power supply have been provided. An advantage of embodiments in accordance with the present invention is that they mitigate stability issues that arise from signal delays and phase lag within the switching power supplies. In addition, they mitigate the effects of sub-harmonic oscillations within the system. Another advantage is the power switching supplies can operate at a lower switching frequency under light load conditions.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A method for controlling a switching power supply, comprising:

generating a compensation signal, wherein the compensation signal is non-DC signal;

generating a first comparison signal in response to comparing the compensation signal with a first signal, the first signal having a ramp portion and a substantially constant portion;

generating a second comparison signal in response to comparing the compensation signal with a second signal, the second signal having a ramp portion and a substantially constant portion; and generating a pulse signal in accordance with the first and second comparison signals.

2. The method of claim 1, wherein generating the compensation signal comprises:

sensing a current;
generating a first voltage signal in response to the current that has been sensed;
generating a second voltage signal;
generating a summation signal by summing the first and second voltage signals; and
generating the compensation signal in response to comparing the summation signal with a third voltage signal.

3. The method of claim 1, wherein the ramp portion of the first signal has a positive slope and the ramp portion of the second signal has a negative slope.

4. The method of claim 1, further including generating the ramp portion of the first signal in response to the compensation signal equaling or exceeding a first voltage.

5. The method of claim 1, further including generating the ramp portion of the second signal in response to the compensation signal becoming at least equal to the ramp portion of the first signal.

6. The method of claim 1, further including clamping the second signal at a first voltage level in response to the second signal decreasing to a voltage equal to or less than the first voltage level.

7. The method of claim 6, further including generating the ramp portion of the second signal in response to the pulse signal transitioning to a logic low voltage level.

8. The method of claim 7, wherein generating the ramp portion of the second signal comprises:
turning off a first transistor; and
charging a first capacitor.

9. The method of claim 8, wherein generating the ramp portion of the first signal comprises:
turning off a second transistor; and
charging a second capacitor.

10. The method of claim 6, wherein clamping the second signal at the first voltage level includes turning on a transistor.

11. The method of claim 6, further including setting the first signal at a second voltage level in response to the compensation signal becoming at least equal to the ramp portion of the first signal.

12. The method of claim 1, further including setting the second signal at a second voltage level in response to the pulse signal transitioning to a logic low voltage level.

13. The method of claim 1, wherein generating the pulse signal in accordance with the first and second comparison signals includes latching at least one of the first and second comparison signals.

14. The method of claim 1, further including generating the ramp portion of the second signal in response to triggering a one shot.

15. A method for controlling a switching power supply, comprising:
generating a compensation signal;
generating a comparison signal at a first input of a latch in response to comparing the compensation signal with a first signal, the first signal having a ramp portion and a first substantially constant portion;
generating an impulse signal at a second input of the latch; and
generating the ramp portion of the first signal in response to the impulse signal.

16. The method of claim 15, further including generating the ramp portion of the first signal by:
turning off a transistor; and
charging a capacitor.

17. The method of claim 15, further including generating the first substantially constant portion of the first signal by clamping the first signal at a first level in response to the comparison signal.

18. The method of claim 15, further including generating the ramp portion of the first signal in response to triggering a one shot.

19. The method of claim 15, wherein the first signal further includes a second substantially constant portion which is generated in response to the compensation signal being substantially the same as a first voltage level.

20. A switching power supply controller, comprising:
a first comparator having first and second inputs and an output;
a first ramp generation circuit having first and second inputs and an output, the output coupled to the first input of the first comparator;
a second comparator having first and second inputs and an output, the first input of the second comparator coupled to the second input of the first comparator;
a second ramp generation circuit having first and second inputs and an output, the output coupled to the second input of the second comparator; and
a latch having first and second inputs and a first output, the output of the first ramp generation circuit coupled to the first input of the latch and the output of the second ramp generation circuit coupled to the second input of the latch.

21. The switching power supply controller of claim 20, wherein the first ramp generation circuit comprises:
a first transistor having a control electrode and first and second current carrying electrodes;
a first capacitor having first and second terminals coupled to the first and second current carrying electrodes of the first transistor, respectively; and
a first current source having first and second current carrying electrodes coupled to the first and second current carrying electrodes of the first transistor.

22. The switching power supply controller of claim 21, wherein the second ramp generation circuit comprises:
a second transistor having a control electrode and first and second current carrying electrodes;
a second capacitor having first and second terminals coupled to the first and second current carrying electrodes of the second transistor, respectively; and
a second current source having first and second current carrying electrodes coupled to the first and second current carrying electrodes of the second transistor.

23. The switching power supply controller of claim 20, further including a one shot coupled between the output of the latch and the first input of the second ramp generation circuit.

24. A switching power supply controller, comprising:
a comparator having first and second inputs and an output;
a ramp generation circuit having first and second inputs and an output, the output of the ramp generation circuit directly coupled to the first input of the comparator;
a latch having first and second inputs and a first output, the output of the ramp generation circuit coupled to the first input of the latch; and
a constant-on-time feedback network having an input coupled to the first output of the latch and an output coupled to the second input of the latch.

25. The switching power supply controller of claim 24, further including a one shot coupled between the first output of the latch and the first input of the ramp generation circuit.

26. The switching power supply controller of claim 24, wherein the ramp generation circuit comprises:

a transistor having a control electrode and first and second current carrying electrodes;
a capacitor having first and second terminals coupled to the first and second current carrying electrodes of the transistor, respectively; and
a current source having first and second current carrying electrodes coupled to the first and second current carrying electrodes of the transistor.

* * * * *